(12) United States Patent
Furuta et al.

(10) Patent No.: US 10,964,780 B2
(45) Date of Patent: Mar. 30, 2021

(54) SEMICONDUCTOR DEVICE

(71) Applicant: LAPIS SEMICONDUCTOR CO., LTD, Yokohama (JP)

(72) Inventors: Kenichi Furuta, Miyazaki (JP);
Toshifumi Kobe, Miyazaki (JP);
Toshiyuki Orita, Miyazaki (JP);
Tsuyoshi Inoue, Miyazaki (JP);
Tomoko Yonekura, Miyazaki (JP);
Masahiro Haraguchi, Miyazaki (JP);
Yoshinobu Takeshita, Miyazaki (JP);
Kiyofumi Kondo, Miyazaki (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/516,272

(22) Filed: Jul. 19, 2019

(65) Prior Publication Data
US 2020/0035783 A1   Jan. 30, 2020

(30) Foreign Application Priority Data

Jul. 26, 2018   (JP) ............................. JP2018-140560

(51) Int. Cl.
*H01L 29/06*   (2006.01)
*H01L 29/40*   (2006.01)

(52) U.S. Cl.
CPC ...... *H01L 29/0623* (2013.01); *H01L 29/0619* (2013.01); *H01L 29/0661* (2013.01); *H01L 29/0692* (2013.01); *H01L 29/402* (2013.01)

(58) Field of Classification Search
CPC ............. H01L 29/0619; H01L 29/0623; H01L 29/0661; H01L 29/402; H01L 29/7811; H01L 29/7823
See application file for complete search history.

(56) References Cited

U.S. PATENT DOCUMENTS 8,466,492 B1 *   6/2013   Mauder ............... H01L 29/0692
257/171
2009/0302376 A1 *   12/2009   Inoue .................. H01L 29/7395
257/329

(Continued)

FOREIGN PATENT DOCUMENTS

JP   H10335631   12/1998

*Primary Examiner* — Eduardo A Rodela
(74) *Attorney, Agent, or Firm* — JCIPRNET

(57) ABSTRACT

The semiconductor device includes a semiconductor substrate of first conductivity type including a cell area and a peripheral area surrounding cell area on a principal surface thereof, a first diffusion layer which is disposed in peripheral area, surrounds the cell area and has a second conductivity type different from the first conductivity type, an electrode which is disposed in the peripheral area, is in contact with the principal surface through an opening provided in an insulating member and is connected to the first diffusion layer, and a second diffusion layer of the first conductivity type which is formed on the principal surface of a region enclosed in the electrode distant from the first diffusion layer when viewed in a direction perpendicular to the principal surface and includes a linear portion having a first width and a curved portion having a portion with a second width greater than the first width.

11 Claims, 4 Drawing Sheets

(56) References Cited

U.S. PATENT DOCUMENTS

| | | | |
|---|---|---|---|
| 2014/0077329 A1* | 3/2014 | Abe | H01L 29/0611 257/488 |
| 2014/0183627 A1* | 7/2014 | Ma | H01L 29/66727 257/334 |
| 2014/0183639 A1* | 7/2014 | Ma | H01L 29/7813 257/356 |
| 2014/0332842 A1* | 11/2014 | Veeramma | H01L 29/87 257/119 |
| 2015/0137220 A1* | 5/2015 | Li | H01L 29/407 257/330 |
| 2015/0228808 A1* | 8/2015 | Liao | H01L 21/283 257/484 |
| 2016/0172436 A1* | 6/2016 | Ho | H01L 29/1608 257/77 |
| 2016/0372540 A1* | 12/2016 | Kitamura | H01L 29/872 |
| 2017/0194314 A1* | 7/2017 | Lee | H01L 29/7436 |
| 2017/0365339 A1* | 12/2017 | Strand | G11C 13/0069 |
| 2017/0365669 A1* | 12/2017 | Kim | H01L 29/0623 |
| 2018/0090479 A1* | 3/2018 | Weyers | H01L 29/7811 |
| 2018/0114829 A1* | 4/2018 | Nagaoka | H01L 29/7811 |
| 2018/0211950 A1* | 7/2018 | Chiu | H01L 29/0692 |
| 2018/0233554 A1* | 8/2018 | Mitsuzuka | H01L 29/4238 |
| 2018/0301445 A1* | 10/2018 | Yam | H01L 27/0262 |
| 2019/0051646 A1* | 2/2019 | Salcedo | H01L 29/404 |
| 2020/0066837 A1* | 2/2020 | Karp | H01L 21/761 |
| 2020/0091283 A1* | 3/2020 | Matsushita | H01L 29/8611 |

* cited by examiner

SEMICONDUCTOR DEVICE

CROSS-REFERENCE TO RELATED APPLICATION

This application claims the priority of Japan patent application serial no. 2018-140560, filed on Jul. 26, 2018. The entirety of the above-mentioned patent application is hereby incorporated by reference herein and made a part of this specification.

BACKGROUND

Technical Field

The disclosure relates to a semiconductor device, and particularly, to a peripheral structure of a semiconductor device having a high withstand voltage.

Related Art

There is a case in which a field plate for promoting improvement of a withstand voltage is provided in a semiconductor device for a high withstand voltage. The field plate is a component in the form of an electrode for controlling distributions of electric fields and is generally provided in order to relax electric fields to avoid electric field concentration.

Patent Document 1 is known as a document pertaining to a field plate, for example. Patent Document 1 discloses a power semiconductor device including a collector region of a first conductivity type, a base region of a second conductivity type formed in the collector region, at least one field strengthened region of the same first conductivity type as the collector region, which is formed a predetermined distance away from the base region in the collector region at a higher density than that of the collector region, and a field plate formed on a junction of the base region and the collector region and the field strengthened region having an insulating layer interposed therebetween. That is, Patent Document 1 discloses the invention in which the field strengthened region is provided under the field plate of a high withstand voltage semiconductor device to disperse electric field concentrated regions and to improve a breakdown voltage of a peripheral structure of the high withstand voltage semiconductor device.

[Patent Document 1] Japanese Patent Application Laid-Open (JP-A) No. Hei 10-335631

As described above, Patent Document 1 discloses a technique for promoting improvement of a withstand voltage of a semiconductor device by providing a field strengthened region under a field plate. However, the main points of the power semiconductor device of Patent Document 1 pertain to a cross-sectional view in a direction perpendicular to a substrate face, and an idea of improving a withstand voltage according to a planar layout of a semiconductor device is not provided. According to recent trends to highly integrate semiconductor devices, improving a withstand voltage while minimizing an increase in a layout area of a semiconductor layer, particularly, a layout area of a peripheral region has become a pressing issue.

SUMMARY

The disclosure provides a semiconductor device including a field plate, which restrains a breakdown voltage decrease while minimizing a layout area increase.

A semiconductor device according to an aspect of the disclosure includes: a semiconductor substrate of a first conductivity type including a cell area and a peripheral area surrounding the cell area on a principal surface thereof; a first diffusion layer which is disposed in the peripheral area, surrounds the cell area and has a second conductivity type different from the first conductivity type; an electrode which is disposed in the peripheral area, is in contact with the principal surface through an opening provided in an insulating member and is connected to the first diffusion layer; and a second diffusion layer having the first conductivity type which is formed on the principal surface of a region enclosed in the electrode distant from the first diffusion layer when viewed in a direction perpendicular to the principal surface and includes a linear portion having a first width and a curved portion having a portion with a second width greater than the first width.

Further, a semiconductor device according to another aspect of the disclosure includes: a semiconductor substrate of a first conductivity type including a cell area and a peripheral area surrounding the cell area on a principal surface thereof; a first diffusion layer which is disposed in the peripheral area, surrounds the cell area and has a second conductivity type different from the first conductivity type; an electrode which is disposed in the peripheral area, is in contact with the principal surface through an opening provided in an insulating member and is connected to the first diffusion layer; and a second diffusion layer of the first conductivity type which is formed on the principal surface of a region enclosed in the electrode distant from the first diffusion layer when viewed in a direction perpendicular to the principal surface and includes a linear portion having a first impurity concentration and a curved portion having a portion with a second impurity concentration lower than the first impurity concentration.

BRIEF DESCRIPTION OF THE DRAWINGS

FIG. 1(a) and FIG. 1(b) illustrate an example of a configuration of a semiconductor device according to embodiments, in which FIG. 1(a) is a plan view, and FIG. 1(b) is a cross-sectional view.

FIG. 2(a) to FIG. 2(c) illustrate an example of a configuration of an electric field relaxation structure according to a first embodiment, in which FIG. 2(a) is a plan view, and FIG. 2(b) and FIG. 2(c) are cross-sectional views.

DESCRIPTION OF THE EMBODIMENTS

Hereinafter, embodiments of the disclosure will be described in detail with reference to the drawings.

First Embodiment

Figure 1A:
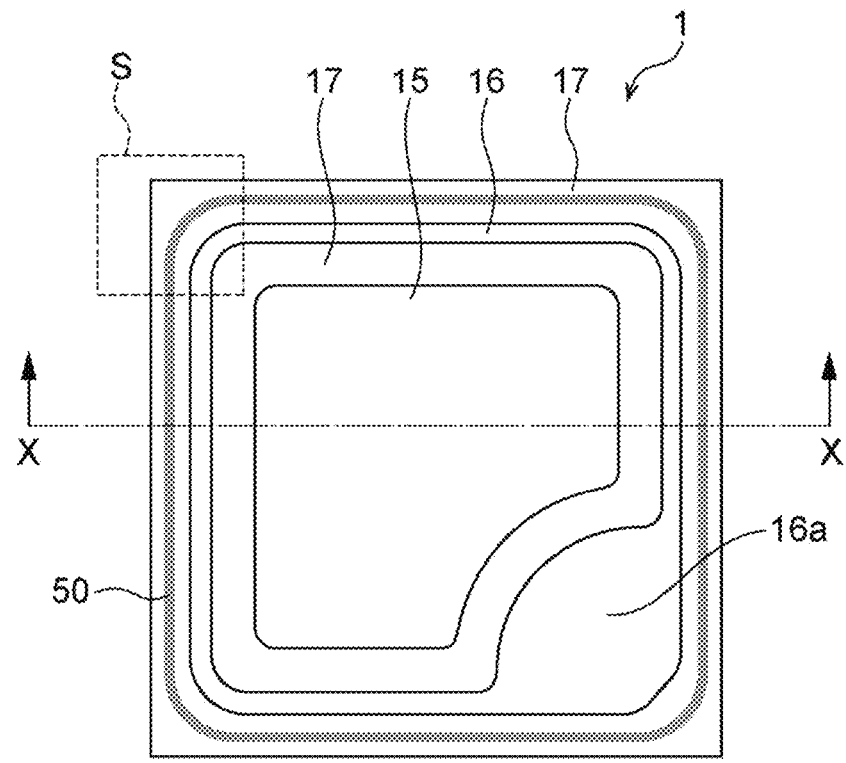
Figure 1B:
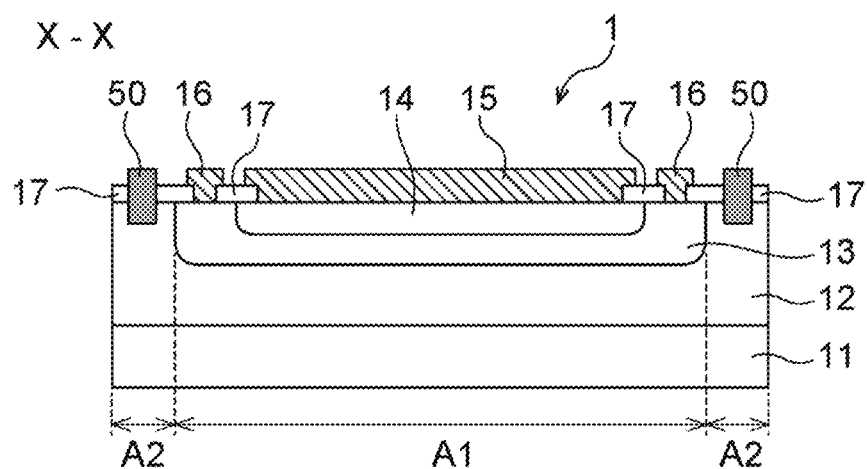

FIG. 1(a) is a plan view illustrating a configuration of a semiconductor device 1 according to the present embodiment and FIG. 1(b) is a cross-sectional view taken along line X-X in FIG. 1(a). In the present embodiment, the semiconductor device 1 is of a planar type having a principal surface in a rectangular shape and includes an NPN-type bipolar transistor.

A collector layer 11 is an N-type semiconductor layer formed by doping an N-type semiconductor substrate (not shown) at a high concentration with additive impurities such as antimony and forms a collector region of the transistor. The collector layer 11 is formed on the back side of the semiconductor device 1. An epitaxial layer 12 is an N-type semiconductor layer in a relatively low concentration which is formed on the surface of the collector layer 11 using a vapor growth method through which a decomposition reaction between a silane compound and a phosphorus compound occurs at a high temperature, for example.

A base diffusion layer 13 is a P-type semiconductor layer formed by adding boron or the like into the surface of the epitaxial layer 12 through a mask for patterning (not shown) and then allowing thermal diffusion of the impurities and forms a base region of the transistor. An emitter diffusion layer 14 is an N-type semiconductor layer in a relatively high concentration which is formed by allowing thermal diffusion of additive impurities such as phosphorus or the like into the surface of the base diffusion layer 13 through a mask for patterning (not shown). In a top view, the base diffusion layer 13 is formed to surround the entire emitter diffusion layer 14. Although the base diffusion layer 13 and the emitter diffusion layer 14 have polygonal shapes with sides along the sides of the semiconductor device 1 in a rectangular shape, each corner thereof is curved to be a smooth arc in order to relax electric field concentration when a reverse bias is applied.

An emitter electrode 15 is made of a conductor such as aluminum and formed to cover the surface of the emitter diffusion layer 14. A base electrode 16 is made of a conductor such as aluminum and formed to cover the surface of the base diffusion layer 13 like the emitter electrode 15. An insulating layer 17 of such as $SiO_2$ is provided between the emitter electrode 15 and the base electrode 16 and thus the emitter electrode 15 and the base electrode 16 are electrically isolated from each other.

Figure 2A:
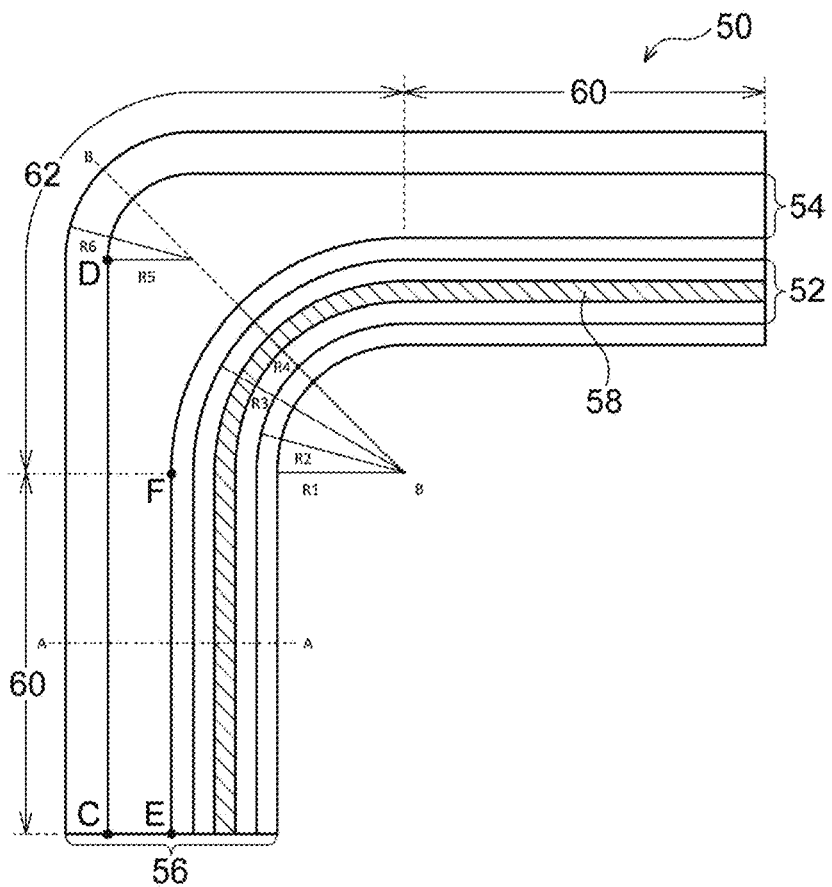
Figure 2B:
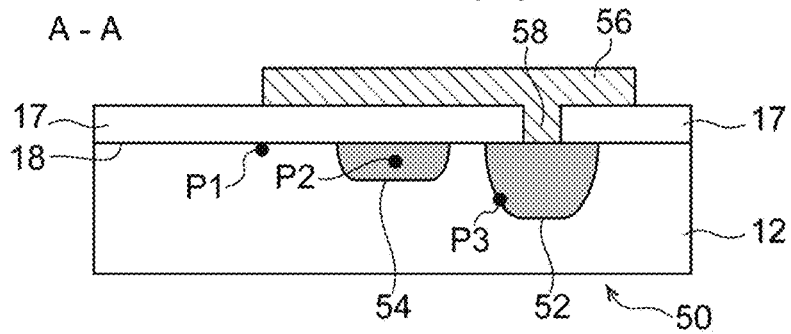

As shown in FIG. 1(a), in the semiconductor device 1, the emitter electrode 15 and the base electrode 16 are exposed from the rectangular principal surface (refer to FIGS. 2(b) and (c)). The emitter electrode 15 has a shape almost the same as the shape of the emitter diffusion layer 14 and each corner thereof is curved to be a smooth arc. In addition, the emitter electrode 15 itself includes a bonding pad for connecting a bonding wire. Meanwhile, the base electrode 16 is formed along the outer edge of the base diffusion layer 13, has a ring-shaped pattern surrounding the entire emitter electrode 15 and includes a bonding pad 16a for connecting a bonding wire connected to the ring-shaped pattern. The base electrode 16 also has corners which are curved to be a smooth arc like the emitter electrode 15. The insulating layer 17 of such as $SiO_2$ or the like, for example, extends outwards from the base electrode 16.

In the semiconductor device 1 according to the present embodiment, an area inside the base diffusion layer 13 and the base electrode 16 becomes an active area A1 in which a transistor operation is performed and an area outside the base diffusion layer becomes an inactive area A2. Meanwhile, in the present embodiment, the active area refers to an area in which an operation for executing a main function of the semiconductor device is performed and the inactive area refers to an area surrounding the active area, which is not directly related to functions of the semiconductor device. In the semiconductor device 1 according to the present embodiment, the corners of the base diffusion layer 13 and the base electrode 16 which define the outer edge of the active area A1 are curved to be rounded, as described above. Further, the active area A1 and the inactive area A2 are an example of a "cell area" and a "peripheral area" according to the disclosure.

The semiconductor device 1 further includes an electric field relaxation structure 50. As will be described later, the electric field relaxation structure 50 includes a diffusion layer formed on the principal surface 18 of the semiconductor device 1 and an electrode having a function of a field plate. The electric field relaxation structure 50 according to the present embodiment is disposed in a ring shape along the outer circumference of the base electrode 16, as illustrated in FIG. 1(a) and FIG. 1(b).

Figure 2C:
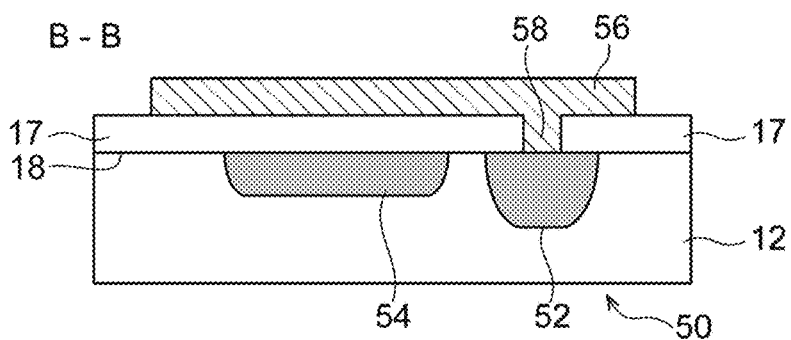

The electric field relaxation structure 50 according to the present embodiment will be described in more detail with reference to FIG. 2(a) to FIG. 2(c). FIG. 2(a) is a plan view enlarging a part of a region S of the electric field relaxation structure 50, shown in FIG. 1(a). In addition, FIG. 2(b) is a cross-sectional view taken along line A-A of FIG. 2(a) and FIG. 2(c) is a cross-sectional view taken along line B-B of FIG. 2(a). The electric field relaxation structure 50 is formed in the inactive area A2 shown in FIG. 1(b). Further, the electric field relaxation structure 50 having the same configuration as that shown in FIG. 2(a) to FIG. 2(c) is disposed with respect to three corners (corner portions) other than the region S shown in FIG. 1(a).

As shown in FIG. 2(a), the electric field relaxation structure 50 includes a P-type diffusion layer 52 formed at a position relatively close to the active area A1, an N-type diffusion layer 54 formed along the outer circumference of the P-type diffusion layer 52, and a field plate 56. In the present embodiment, the impurity concentration of the N-type diffusion layer 54 is higher than that of the epitaxial layer 12. The P-type diffusion layer 52 and the field plate 56 are connected to each other through a contact 58 formed in an opening provided in the insulating layer 17. As shown in FIG. 2(b), the P-type diffusion layer 52 and the N-type diffusion layer 54 are formed in the N-type epitaxial layer 12. Meanwhile, R1 and R6 represent radiuses of both edges of the field plate 56 in a plan view, R2 and R3 represent radiuses of both edges of the P-type diffusion layer 52, and R4 and R5 represent radiuses of both edges of the N-type diffusion layer 54 in FIG. 2(a). In FIG. 2(a), the centers of the radiuses R1, R2, R3 and R4 are at the same position and the centers of the radiuses R5 and R6 are at the same position.

Here, as a method for improving the withstand voltage of semiconductor device, there is a method of relaxing concentration of electric fields generated in components of the semiconductor device. It is because that concentration of electric fields is equivalent to increase in a voltage applied to the concentration portion. Meanwhile, there is a method of expanding a depletion layer generated in a semiconductor device to disperse electric fields as a method for relaxing electric field concentration, and techniques such as using a guard ring and a field plate are known as techniques for dispersing electric fields.

In general, a PN junction is formed when an N-type diffusion layer and a P-type diffusion layer are in contact with each other, and a depletion layer is generated when a reverse bias is applied to the PN junction. Although the depletion layer shrinks at the edge of the P-type diffusion layer, if another P-type diffusion layer is disposed at a slight distance from the edge, the interface of the PN junction laterally extends and the depletion layer extends outward and thus electric field concentration can be relaxed. The P-type diffusion layer in this case is generally called a guard ring. The P-type diffusion layer 52 according to the present embodiment has a function of a guard ring and causes a depletion layer formed between the P-type base diffusion layer 13 and the N-type epitaxial layer 12 to extend from the P-type base diffusion layer 13.

A main function of the field plate is also extension of a depletion layer. The field plate is a technique for laterally expanding a depletion layer by forming a component similar to a metal oxide semiconductor (MOS) device on the principal surface 18 of a semiconductor substrate. A region directly under a structure similar to an MOS is depleted by forming the structure similar to the MOS at the edge of a P-type diffusion layer (the base diffusion layer 13 in the present embodiment) at which a depletion layer easily shrinks and applying a reverse bias at a voltage lower than that of an N-type diffusion layer (the collector layer 11 in the present embodiment) to thereby improve a withstand voltage. The field plate 56 according to the present embodiment has such a function and expands a depletion layer to disperse electric field distributions. The field plate 56 may be formed of a material such as aluminum in a wiring process, for example.

Meanwhile, in an exemplary embodiment, the depletion layer is expanded using the P-type diffusion layer 52 and the field plate 56 from the viewpoint of relaxation of electric field concentration. However, avoiding expansion of the depletion layer is more than needed because this may lead to an increase in the layout area of the semiconductor device 1. Expansion of the depletion layer is controlled by the N-type diffusion layer 54. That is, the N-type diffusion layer 54 has a function of causing expansion of the depletion layer from the active area A1 to be restrained. In the present embodiment, the layout of the semiconductor device 1 is restricted to a shape by interposing the N-type diffusion layer 54 in the depletion layer. In other words, the N-type diffusion layer 54 which holds the depletion layer constitutes one of electric field concentration regions (regions in which electric fields are strong, which may be referred to as "electric field concentration regions" hereinafter). In addition, the N-type diffusion layer 54 constituting an electric field concentration region can further relax electric field concentration by being increased in length in a specific direction.

Here, an electric field concentration region in the electric field relaxation structure 50 according to the present embodiment is considered. As shown in FIG. 2(b), the main electric field concentration regions in the electric field relaxation structure 50 are three regions: a region P1 which is a region of the principal surface of the epitaxial layer 12 corresponding to the edge of the field plate 56 on the side of the inactive area A2; a region P2 inside the N-type diffusion layer 54; and a region P3 which is the edge of the P-type diffusion layer 52 on the side of the inactive area A2. In other words, in the electric field relaxation structure 50 according to the present embodiment, electric field concentration is dispersed to three points (the P-type diffusion layer 52, the N-type diffusion layer 54 and the field plate 56) and electric fields are received in the entire electric field relaxation structure 50. In addition, since electric field concentration is dispersed to three points, in an exemplary embodiment, the N-type diffusion layer 54 is disposed in a region of the principal surface included in the field plate 56 without being in contact with the edge of the field plate 56 in a planar view.

In the semiconductor device 1 according to the present embodiment, the widths of the N-type diffusion layer 54 and the field plate 56 are extended at corners (corner portions) of the external form of the semiconductor device 1. That is, as apparent from comparison of FIG. 2(c) with FIG. 2(b), the widths of the N-type diffusion layer 54 and the field plate 56 are extended (widened) at a corner portion. Although the P-type diffusion layer 52, the N-type diffusion layer 54 and the field plate 56 are formed to be a smooth arc at corners thereof in the present embodiment since electric fields are generally concentrated on a sharp tip portion of a conductor, the N-type diffusion layer 54 and the field plate 56 are further widened at corners thereof and the widths of the N-type diffusion layer 54 and the field plate 56 are maximized at a position of a bisector that passes through the center point and the center of the arc forming each corner (the position of line B-B in FIG. 2(a)) in the semiconductor device 1 according to the present embodiment. Furthermore, when points C and D on the outer circumference of the N-type diffusion layer 54 and points E and F on the inner circumference of the N-type diffusion layer 54 are considered, as shown in FIG. 2(a), a straight line C-D which connects between the points C and D is longer than a straight line E-F which connects between the points E and F. However, the point C is one point on the outer circumference of the N-type diffusion layer 54, the point E is one point on the inner circumference corresponding to the position of the point C, the point D is a point at which a straight line is switched to a corner on the outer circumference, and the point F is a point at which a straight line is switched to a corner on the inner circumference. Accordingly, in the semiconductor device 1 according to the present embodiment, a layout area increase is restrained while a withstand voltage decrease is minimized in the semiconductor device having a field plate. In the following description, a region of the electric field relaxation structure 50 which has the cross-sectional configuration of FIG. 2(b) will be referred to as a "linear portion 60" and a region in which the N-type diffusion layer 54 and the field plate 56 are widened from the configuration of FIG. 2(b), as shown in FIG. 2(c), will be referred to as a "curved portion 62."

As described above, according to the semiconductor device according to the present embodiment, it is possible to improve the withstand voltage of the semiconductor device because the P-type diffusion layer and the N-type diffusion layer are provided on the principal surface of the semiconductor substrate which corresponds to (is positioned directly under) the field plate to relax electric field concentration occurring at the edge of the field plate. Furthermore, the width of the N-type diffusion layer in a curved portion is made greater than the width of the N-type diffusion layer in a linear portion and thus further relaxes electric field concentration occurring in the curved portion. That is, improvement of a withstand voltage of corners at which the withstand voltage easily decreases due to electric field concentration is realized while minimizing a layout area increase by widening the field plate only at the corners of the semiconductor device. In other words, although widening of the field plate is an effective means for improving a withstand voltage, simply widening the field plate leads to a chip size increase. Accordingly, the present embodiment promotes withstand voltage improvement without causing a layout area increase by effectively using the curved portion 62 formed to be a smooth arc.

Modified Example of First Embodiment

Figure 3:
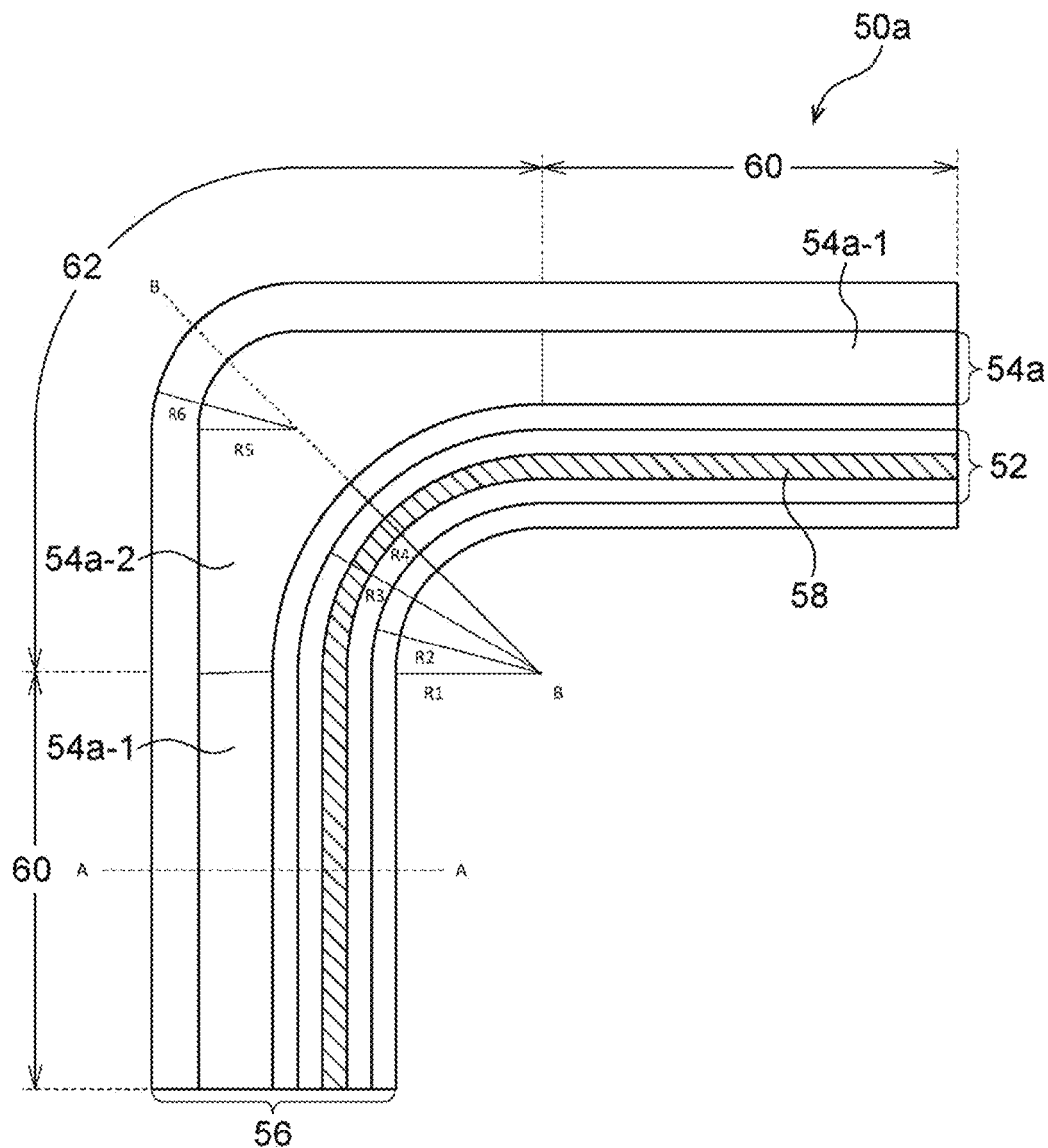
FIG. 3 is a plan view illustrating an example of a configuration of an electric field relaxation structure according to a modified example of the first embodiment.

The semiconductor device according to the present embodiment will be described with reference to FIG. 3. The semiconductor device according to the present embodiment includes an electric field relaxation structure 50a replacing the electric field relaxation structure 50 of the above-described semiconductor device 1 and has the same configuration as that of FIG. 1. Accordingly, reference is made to FIG. 1 as necessary and detailed description will be omitted. The electric field relaxation structure 50a shown in FIG. 3 shows a part of the region S of the ring-shaped electric field relaxation structure 50a, which is shown in FIG. 1(a). Further, the electric field relaxation structure 50a having the same configuration as that shown in FIG. 3 is disposed with respect to three corners (corner portions) other than the region S shown in FIG. 1(a).

Although a planar layout of the electric field relaxation structure 50a is almost the same as the electric field relaxation structure 50 shown in FIG. 2(a), the N-type diffusion layer 54 shown in FIG. 2(a) is replaced with an N-type diffusion layer 54a in the electric field relaxation structure 50. In addition, the N-type diffusion layer 54a is composed of two regions having different impurity concentrations, as shown in FIG. 3. That is, the two regions are a high concentration region 54a-1 having a relatively high concentration and a low concentration region 54a-2 having a relatively low concentration. In addition, the high concentration region 54a-1 is disposed to correspond to the linear portion 60 and the low concentration region 54a-2 is disposed to correspond to the curved portion 62.

In the electric field relaxation structure 50a according to the present embodiment, the concentration at corners is reduced in order to relax electric fields in the corners. Meanwhile, since a depletion layer easily expands when the concentration at the corners is reduced, the width of the N-type diffusion layer 54a-2 at the corners is increased in order to sufficiently relax electric fields at the corners of the field plate 56 corresponding to the radius R6. That is, when impurity concentration is uniform over the linear portion 60 and the curved portion 62, electric fields are relatively easily concentrated on the corner of the curved portion 62. Accordingly, impurity concentration is intentionally unbalanced to relax electric fields at the corners in the present embodiment. Accordingly, the withstand voltage is further improved.

As described above, according to the semiconductor device according to the present embodiment, the same effects as those of the semiconductor device 1 according to the above-described embodiment is obtained, and electric field concentration occurring at corners is further relaxed by decreasing the impurity concentration of the N-type diffusion layer 54a-2 in the curved portion 62 to below the impurity concentration of the N-type diffusion layer 54a-1 of the linear portion 60. Accordingly, it is possible to more certainly realize improvement of a withstand voltage at corners at which the withstand voltage easily decreases due to electric field concentration while minimizing an increase in the area of the field plate.

Second Embodiment

Figure 4:
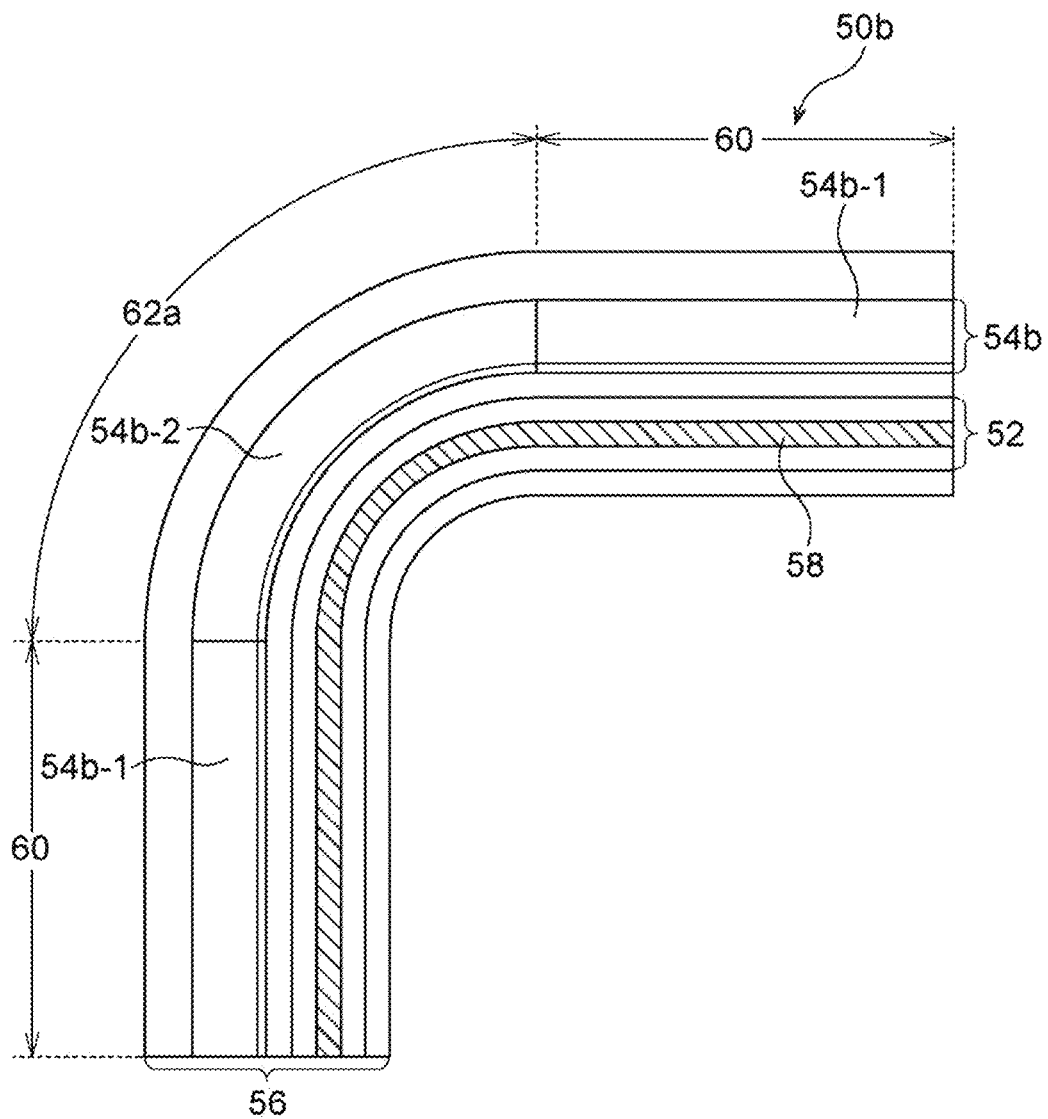
FIG. 4 is a plan view illustrating an example of a configuration of an electric field relaxation structure according to a second embodiment.

A semiconductor device according to the present embodiment will described with reference to FIG. 4. The semiconductor device according to the present embodiment includes an electric field relaxation structure 50b which replaces the electric field relaxation structure 50 of the above-described semiconductor device 1 and has the same configuration as that of the semiconductor device of FIG. 1. Accordingly, detailed description will be omitted by referring to FIG. 1 as necessary. The electric field relaxation structure 50b shown in FIG. 4 shows a part of the region S of the ring-shaped electric field relaxation structure 50b, which is shown in FIG. 1(a). Further, the electric field relaxation structure 50b having the same configuration as that shown in FIG. 4 is disposed with respect to three corners (corner portions) other than the region S shown in FIG. 1(a).

The electric field relaxation structure 50b according to the present embodiment includes a curved portion 62a which replaces the curved portion 62 of the electric field relaxation structure 50a shown in FIG. 3 and an N-type diffusion layer 54b which replaces the N-type diffusion layer 54a. The N-type diffusion layer 54b includes a high concentration region 54b-1 having a relatively high concentration and a low concentration region 54b-2 having a relatively low concentration, and the high concentration region 54b-1 is disposed to correspond to the linear portion 60 and the low concentration region 54b-2 is disposed to correspond to the curved portion 62a. The curved portion 62a of the N-type diffusion layer 54b does not have a widened part like the curved portion 62 and has a shape naturally curved from the linear portion 60 without the width thereof changing.

According to the semiconductor device according to the present embodiment, it is possible to improve the withstand voltage of the semiconductor device because the P-type diffusion layer and the N-type diffusion layer are provided on the principal surface of the semiconductor substrate corresponding to (positioned below) the field plate to relax electric field concentration occurring at the edge of the field plate. Furthermore, in the semiconductor device according to the present embodiment, the N-type diffusion layer 54b of the curved portion 62a is formed as the low concentration region 54b-2 and the N-type diffusion layer 54b of the linear portion 60 is formed as the high concentration region 54b-1 such that the impurity concentration of the N-type diffusion layer 54b in the curved portion 62a is lower than the impurity concentration of the N-type diffusion layer 54b in the linear portion 60. Accordingly, it is possible to relax electric field concentration occurring at corners of the electric field relaxation structure 50b and realize improvement of a withstand voltage at the corners at which the withstand voltage easily decreases due to electric field concentration while minimizing an increase in the area of the field plate.

Meanwhile, although an NPN-type bipolar transistor has been exemplified as the semiconductor device according to the disclosure in each of the above-described embodiments, the disclosure is not limited thereto and may be applied to a PNP-type bipolar transistor. In this case, the impurity types of the P-type diffusion layer 52, the N-type diffusion layer 54 and the like are reversed. In addition, the semiconductor element disposed in the active area A1 is not limited to a bipolar transistor and may be a MOS transistor, a diode and the like, for example.

Furthermore, although a case in which the P-type diffusion layer 52 is a 1-level layer has been described as an example in each of the above-described embodiments, the disclosure is not limited thereto and multiple layers may be disposed in a ring shape (nest shape). Accordingly, a semiconductor device with a further improved withstand voltage is obtained.

According to the disclosure, an effect of providing a semiconductor device including a field plate, which restrains a withstand voltage decrease while minimizing a layout area increase is obtained.

What is claimed is:
1. A semiconductor device, comprising:
  a semiconductor substrate of a first conductivity type comprising a cell area and a peripheral area surrounding the cell area on a principal surface thereof;
  a first diffusion layer which is disposed in the peripheral area, surrounds the cell area and has a second conductivity type different from the first conductivity type;

an electrode which is disposed in the peripheral area, is in contact with the principal surface through an opening provided in an insulating member and is connected to the first diffusion layer; and a second diffusion layer of the first conductivity type which is formed on the principal surface of a region enclosed in the electrode distant from the first diffusion layer when viewed in a direction perpendicular to the principal surface and comprises a linear portion having a first width and a curved portion having a portion with a second width greater than the first width, wherein an impurity concentration of the second diffusion layer is higher than an impurity concentration of the semiconductor substrate.

2. The semiconductor device according to claim 1, wherein the electrode is disposed to surround the cell area.

3. The semiconductor device according to claim 2, wherein the second diffusion layer is disposed to surround the first diffusion layer.

4. The semiconductor device according to claim 2, wherein the linear portion has a first impurity concentration and the curved portion has a second impurity concentration lower than the first impurity concentration.

5. The semiconductor device according to claim 1, wherein the second diffusion layer is disposed to surround the first diffusion layer.

6. The semiconductor device according to claim 5, wherein the linear portion has a first impurity concentration and the curved portion has a second impurity concentration lower than the first impurity concentration.

7. The semiconductor device according to claim 1, wherein the linear portion has a first impurity concentration and the curved portion has a second impurity concentration lower than the first impurity concentration.

8. A semiconductor device, comprising:
a semiconductor substrate of a first conductivity type comprising a cell area and a peripheral area surrounding the cell area on a principal surface thereof;
a first diffusion layer which is disposed in the peripheral area, surrounds the cell area and has a second conductivity type different from the first conductivity type;
an electrode which is disposed in the peripheral area, is in contact with the principal surface through an opening provided in an insulating member and is connected to the first diffusion layer; and
a second diffusion layer of the first conductivity type which is formed on the principal surface of a region enclosed in the electrode distant from the first diffusion layer when viewed in a direction perpendicular to the principal surface and comprises a linear portion having a first impurity concentration and a curved portion having a portion with a second impurity concentration lower than the first impurity concentration,
wherein an impurity concentration of the second diffusion layer is higher than an impurity concentration of the semiconductor substrate.

9. The semiconductor device according to claim 8, wherein the electrode is disposed to surround the cell area.

10. The semiconductor device according to claim 9, wherein the second diffusion layer is disposed to surround the first diffusion layer.

11. The semiconductor device according to claim 8, wherein the second diffusion layer is disposed to surround the first diffusion layer.

* * * * *